(12) United States Patent
Nakayama et al.

(10) Patent No.: US 8,704,410 B2
(45) Date of Patent: Apr. 22, 2014

(54) SEMICONDUCTOR DEVICE (75) Inventors: Koichi Nakayama, Kawasaki (JP);
Tetsuyoshi Shiota, Kawasaki (JP);
Kenichi Kawasaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 109 days.

(21) Appl. No.: 12/962,809

(22) Filed: Dec. 8, 2010

(65) Prior Publication Data

US 2011/0304380 A1  Dec. 15, 2011

(30) Foreign Application Priority Data

Dec. 9, 2009  (JP) .................................. 2009-279726

(51) Int. Cl.
*H01H 47/00* (2006.01)

(52) U.S. Cl.
USPC ............. 307/130; 307/81; 307/112; 327/384; 327/544

(58) Field of Classification Search
USPC ....................... 327/544, 80–98, 384
See application file for complete search history.

(56) References Cited

U.S. PATENT DOCUMENTS

| 6,384,674 | B2* | 5/2002 | Tanizaki et al. | 327/544 |
| 6,635,934 | B2* | 10/2003 | Hidaka | 257/369 |
| 6,759,873 | B2* | 7/2004 | Kang et al. | 326/81 |
| 7,202,700 | B2* | 4/2007 | Isono | 326/81 |
| 7,486,107 | B1* | 2/2009 | Bose et al. | 326/33 |
| 7,712,066 | B2* | 5/2010 | Gasper et al. | 716/122 |
| 7,851,948 | B2* | 12/2010 | Kawasaki | 307/130 |
| 2008/0296977 | A1* | 12/2008 | Kawasaki | 307/81 |

FOREIGN PATENT DOCUMENTS

JP  2008-300696 A  12/2008

* cited by examiner

*Primary Examiner* — Brandon S Cole
(74) *Attorney, Agent, or Firm* — Fujitsu Patent Center (57) ABSTRACT

A semiconductor device includes: a first power line to supply a first voltage to a plurality of internal circuits; a second power line to supply the first voltage to the plurality of internal circuits; a first switch provided between said first power line and each of the plurality of internal circuits; a second switch provided between said second power line and each of the plurality of internal circuits; and a control circuit to control the first switch of a second internal circuit included in the plurality of the internal circuits based on the amounts of noise and voltage drop at power-on in a first circuit included in the plurality of internal circuits.

4 Claims, 12 Drawing Sheets

SEMICONDUCTOR DEVICE

CROSS-REFERENCE TO RELATED APPLICATIONS

This application claims the benefit of priority from Japanese Patent Application No. 2009-279726 filed on Dec. 9, 2009, the entire contents of which are incorporated herein by reference.

BACKGROUND

1. Field

Embodiments discussed herein relate to a semiconductor device including a power supply control circuit.

2. Description of Related Art

A semiconductor device may include a power supply control circuit for controlling the supply of electric power to internal circuitry. The power supply control circuit partially cuts off power supply to any non-operating part of the internal circuitry, for example.

A related art is disclosed in Japanese Laid-open Patent Publication No. 2008-300696, for instance.

SUMMARY

According to one aspect of the embodiments, a semiconductor device includes: a first power line to supply a first voltage to a plurality of internal circuits; a second power line to supply the first voltage to the plurality of internal circuits; a first switch provided between said first power line and each of the plurality of internal circuits; a second switch provided between said second power line and each of the plurality of internal circuits; and a control circuit to control the first switch of a second internal circuit included in the plurality of the internal circuits based on amounts of noise and voltage drop at power-on in a first circuit included in the plurality of internal circuits.

Additional advantages and novel features of the invention will be set forth in part in the description that follows, and in part will become more apparent to those skilled in the art upon examination of the following or upon learning by practice of the invention.

DESCRIPTION OF EMBODIMENTS

Providing a bypass power supply wiring may reduce a quantity of power supply wiring and increase the impedance of the power supply wiring.

Figure 1:
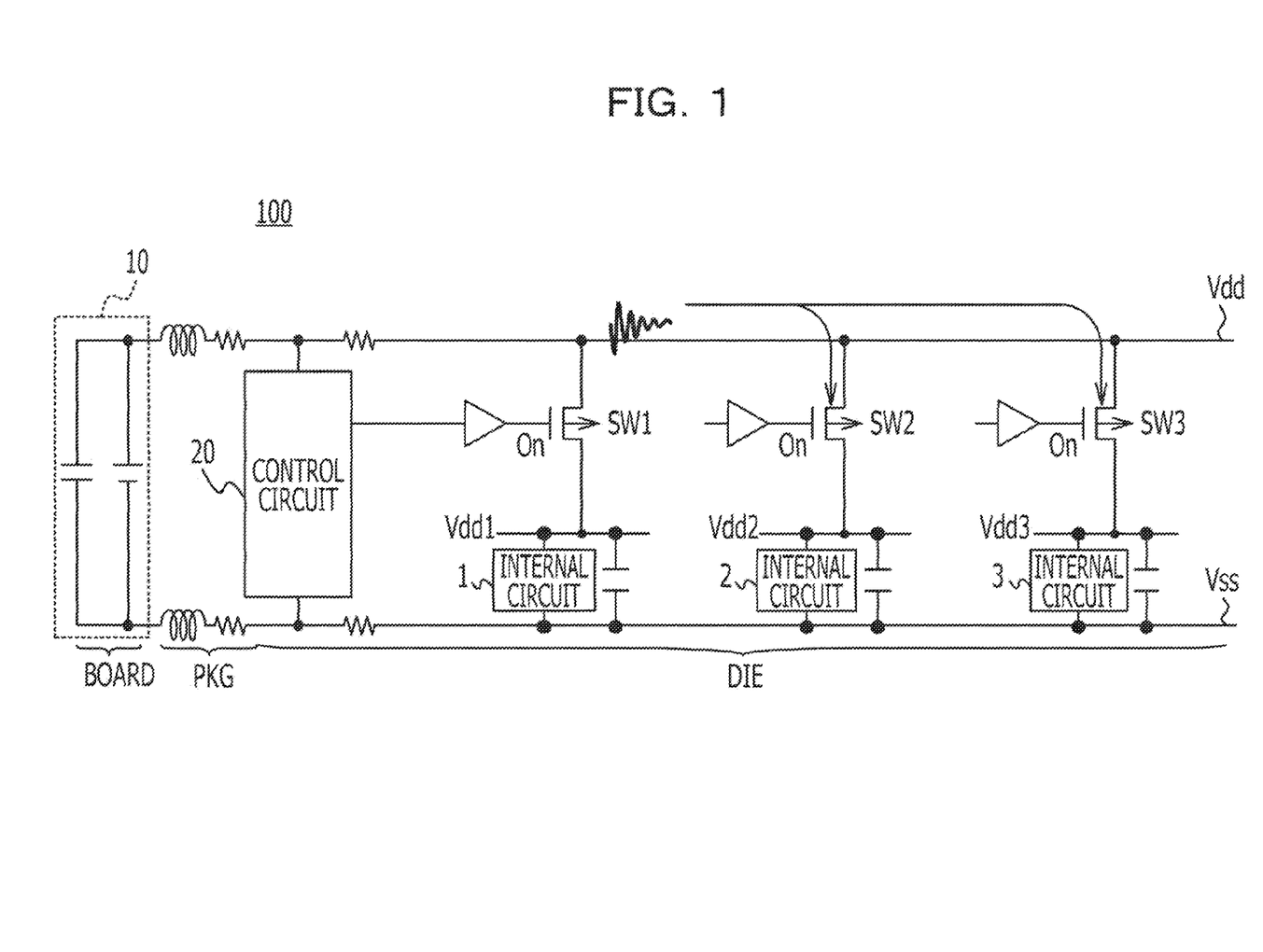
FIG. 1 illustrates an exemplary semiconductor device.

FIG. 1 illustrates an exemplary semiconductor device. A semiconductor device 100 includes a power supply block 10, a power line Vdd, a power line Vss and internal circuits 1 to 3. The power supply block 10, which is provided on a semiconductor substrate (or board) for example, supplies electric power to the inside of a semiconductor chip (or die) through wiring formed in a package (PKG). The power supply block 10 supplies from one output terminal thereof a first voltage to the power line Vdd, and from another output terminal a second voltage to the power line Vss. For example, the first voltage may be a source voltage Vdd and the second voltage may be a ground voltage Vss. Other voltages may be used as the first and second voltages.

The semiconductor device 100 further includes switches SW1 to SW3 provided between the respective internal circuits 1 to 3 and the power line Vdd, and a control circuit 20 for controlling the switches SW1 to SW3. The internal circuits 1 to 3 are coupled between virtual power lines Vdd1 to Vdd3 and the power line Vss, and the source voltage Vdd is supplied to the virtual power lines Vdd1 to Vdd3 through the switches SW1 to SW3, respectively. The control circuit 20 controls the supply of the source voltage Vdd to the internal circuits 1 to 3 by controlling the respective switches SW1 to SW3.

For example, while one of the internal circuits is operating, the other of the internal circuits 1 to 3 may be powered on. When the internal circuits 2 and 3 are in operation, for example, the switches 2 and 3 are kept on, based upon signals fed from the control circuit 20. If the internal circuit 1 is powered on in this state, the control circuit 20 turns on the switch SW1 so that the power line Vdd is coupled to the internal circuit 1. When the internal circuit 1 is powered on, noise may be induced in the power line Vdd. Such noise may be transmitted to the internal circuits 2 and 3 via the respective switches 2 and 3, and the internal circuits 2 and 3 may malfunction (refer to arrows illustrated in FIG. 1).

Figure 2:
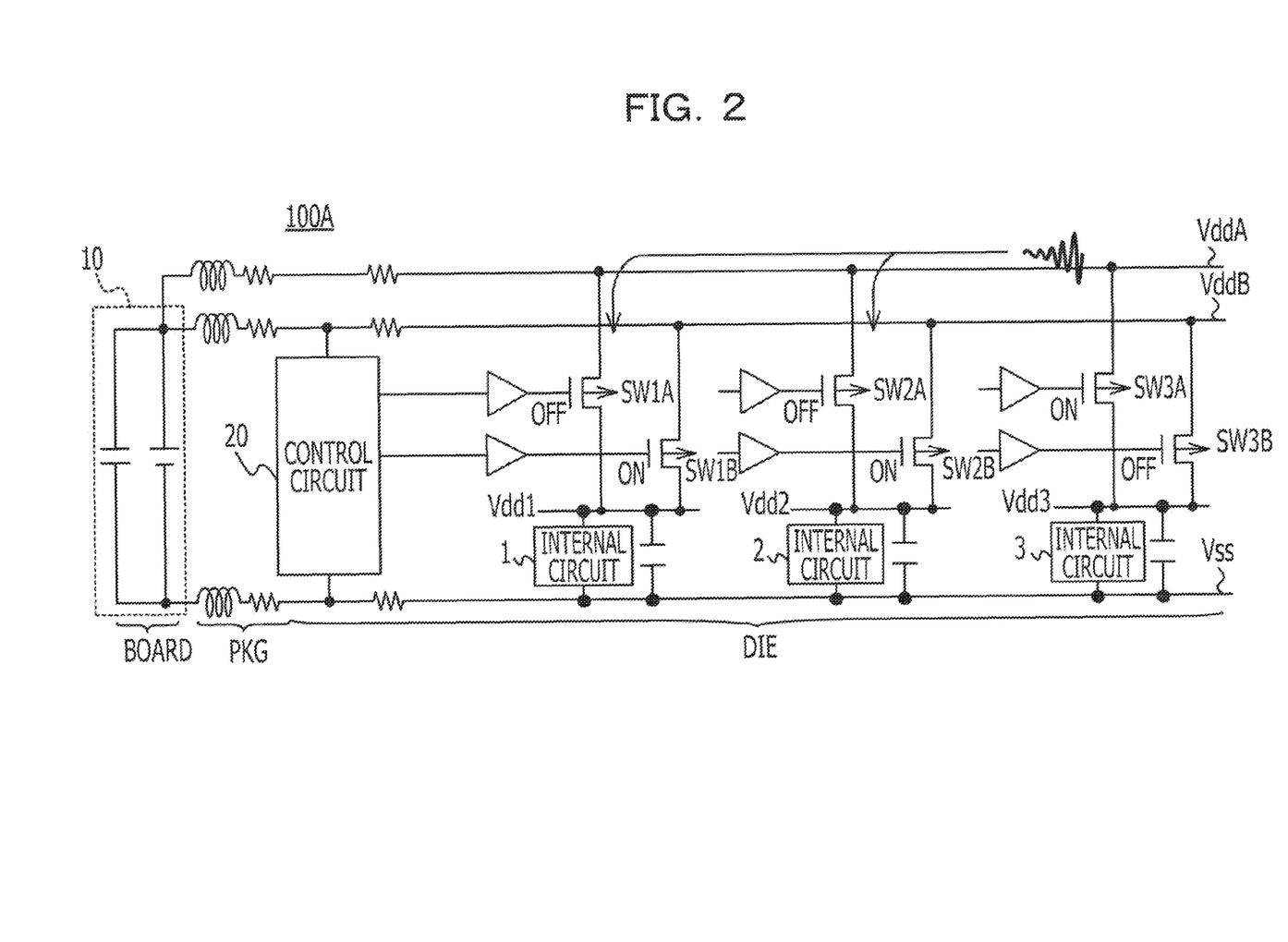
FIG. 2 illustrates an exemplary semiconductor device.

FIG. 2 illustrates an exemplary semiconductor device. A semiconductor device 100A includes a power line VddB, a power line Vss, and a bypass power line VddA. The semiconductor device 100A further includes first switches SW1A to SW3A, which are provided between the bypass power line VddA and respective internal circuits 1 to 3, and are controlled by a control circuit 20. Other elements of the semiconductor device 100A may be substantially the same as or similar to those illustrated in FIG. 1. The power line VddB may correspond to the power line Vdd illustrated in FIG. 1, and second switches SW1B to SW3B may correspond to the switches SW1 to SW3 illustrated in FIG. 1.

The bypass power line VddA may be a first power line for supplying the source voltage when the individual circuits 1 to 3 start to operate after power-on. The bypass power line VddA, which is arranged to run parallel to the power line VddB, may supply substantially the same voltage as the power line VddB to the internal circuits 1 to 3. The power line VddB may be a second power line for supplying a voltage (electric power) to the internal circuits 1 to 3 during operation. The bypass power line VddA may have a smaller power supply capacity than that of the power line VddB. The power line Vss may be a third power line for supplying a second voltage to the internal circuits 1 to 3.

Figure 3:
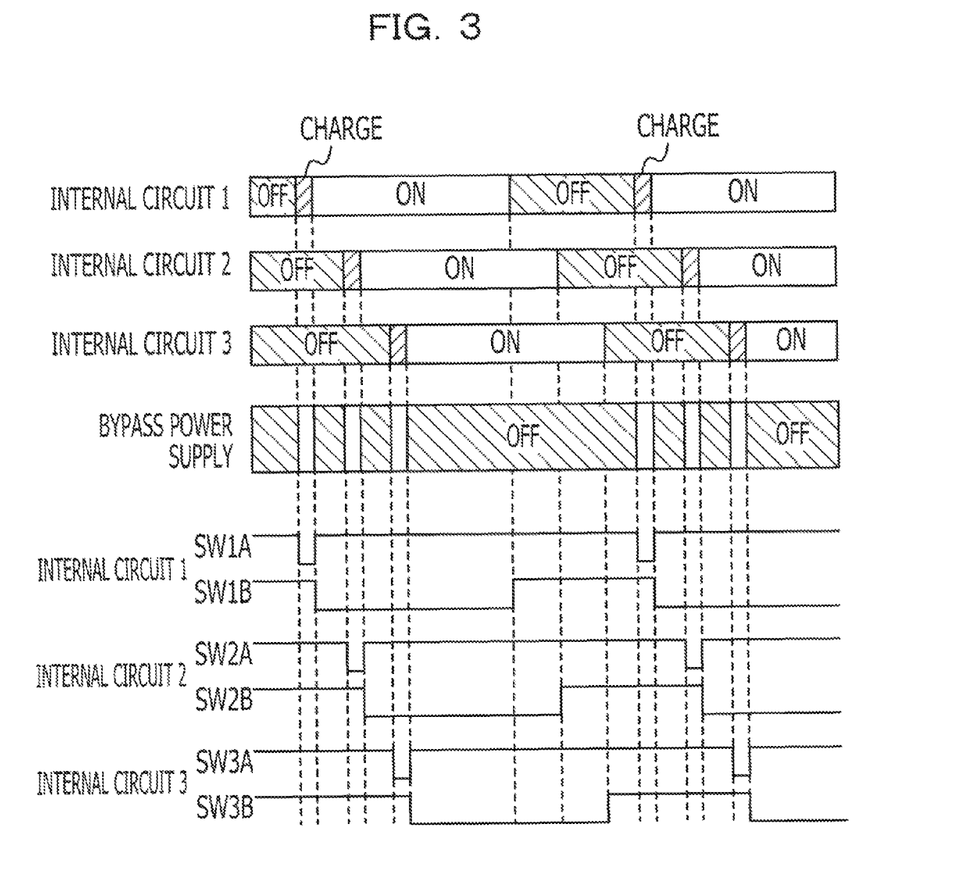
FIG. 3 illustrates an exemplary operation of a semiconductor device.

FIG. 3 illustrates an exemplary operation of a semiconductor device. The operation illustrated in FIG. 3 may be performed by the semiconductor device 100A illustrated in FIG. 2. The internal circuits 1, 2, and 3 may be sequentially powered on in this order, for example. As depicted in FIG. 3, a high (H) level indicates that the first switches SW1A to SW3A and the second switches SW1B to SW3B are turned off, while a low (L) level indicates that the first switches SW1A to SW3A and the second switches SW1B to SW3B are turned on. Upon power-on of the internal circuit 1, the control circuit 20 keeps the first switch SW1A on for a certain period of time to charge the virtual power line Vdd1 of the internal circuit 1. This period of time may be referred to as a "charge period" of the internal circuit 1. The control circuit 20 then turns on the second switch SW1B to supply a voltage for the operation of the internal circuit 1 for a certain period of time. This period of time may be referred to as an "on period" of the internal circuit 1. After the internal circuit operates and the second switch SW1B is turned on, the first switch SW1A is turned off. The switches SW2A and SW2B of the internal circuit 2 and the switches SW3A and SW3B of the internal circuit 3 may be turned on and off in a manner similar to the switches SW1A and SW1B. If the internal circuit 3 is powered on while the internal circuit 1 and the internal circuit 2 are operating, for example, noise induced in the bypass power line VddA may not transmit to the internal circuit 1 or the internal circuit 2 since the first switches SW1A and SW2A are off. The influence of noise at power-on may be reduced.

Since the semiconductor device 100A illustrated in FIG. 2 includes the power line VddB and the bypass power line VddA, a distribution of power line resources may be performed. The semiconductor device 100 illustrated in FIG. 1 and the semiconductor device 100A illustrated in FIG. 2, for example, may have substantially the same size. Since the total quantity of the power lines of the semiconductor device 100 is substantially equal to that of the power lines of the semiconductor device 100A, the semiconductor device 100A may use part of the power line Vdd, such as 10% thereof, as the bypass power line VddA. Compared to the power line Vdd of the semiconductor device 100, the power line VddB of the semiconductor device 100A may have a reduced current supply capacity and an increased impedance.

Figure 4:
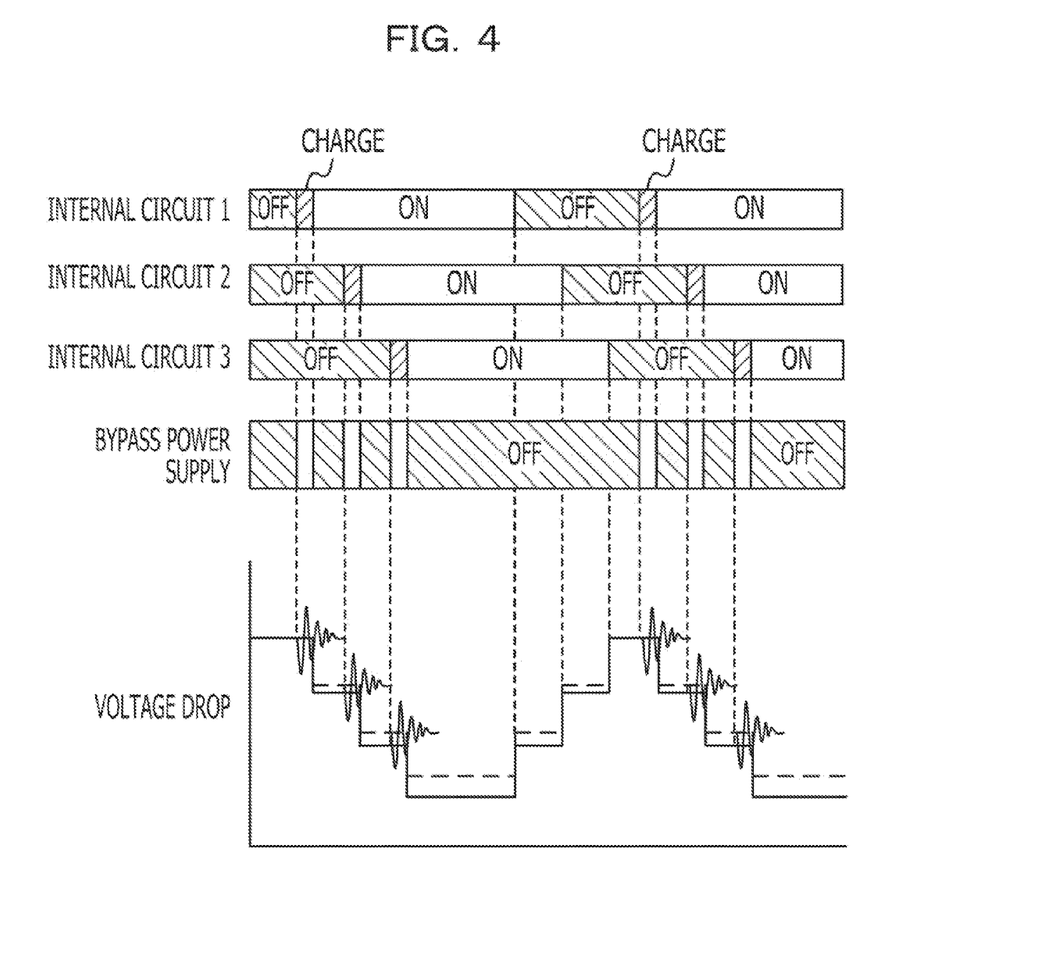
FIG. 4 illustrates an exemplary voltage change of a power line.

FIG. 4 illustrates an exemplary voltage change of a power line. A voltage drop illustrated in FIG. 4 may correspond to a voltage drop of the power line Vdd of the semiconductor device 100 illustrated in FIG. 1 and the power line VddB of the semiconductor device 100A illustrated in FIG. 2. The voltage level of the power line Vdd (VddB) may drop in a steplike fashion as the number of internal circuits in operation increases. While the semiconductor device 100A illustrated in FIG. 2 is configured to reduce noise induced at power-on, the amount of each voltage drop during operation may increase due to an increase in the impedance of the power supply wiring.

Figure 5:
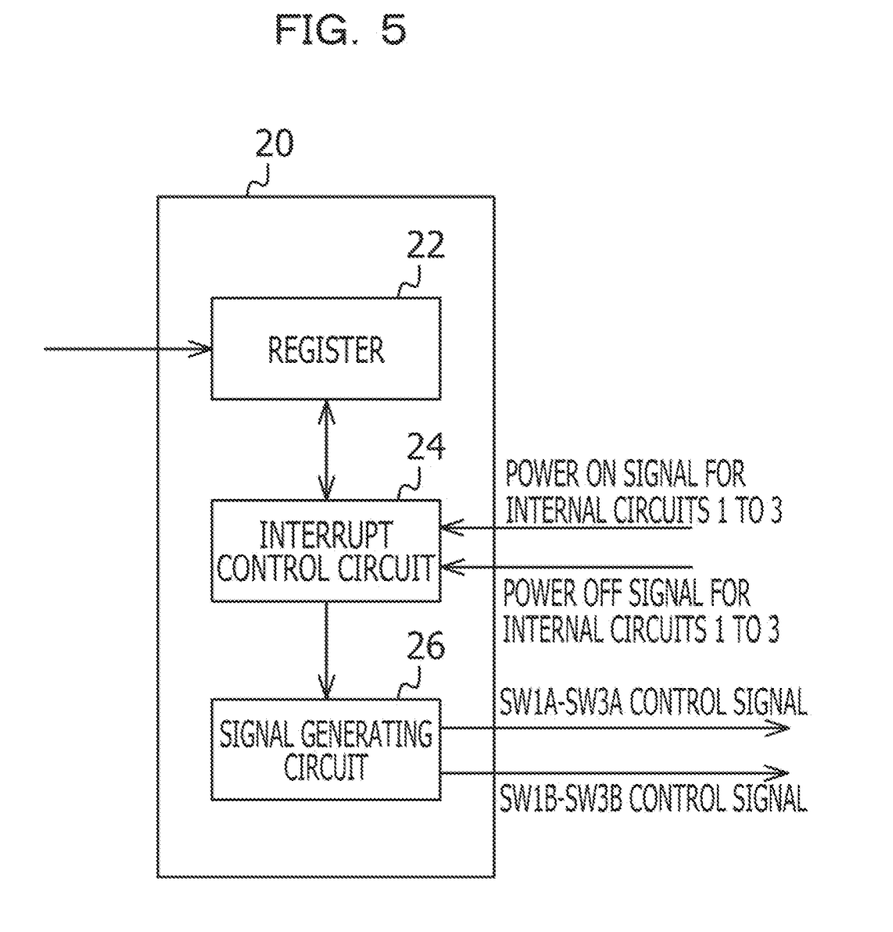
FIG. 5 illustrates an exemplary control circuit.

FIG. 5 illustrates an exemplary control circuit. The control circuit 20 illustrated in FIG. 5 may be included in the semiconductor device 100A illustrated in FIG. 2. The semiconductor device including the control circuit 20 illustrated in FIG. 5 includes as power lines for supplying a voltage to each of the internal circuits 1 to 3 the bypass power line VddA, the power line VddB, and the power line Vss.

The control circuit 20 further includes a register 22, an interrupt control circuit 24, and a signal generating circuit 26. The register 22 reads information (hereinafter referred to as decision information) for a decision process from an external memory, for example, and retains the decision information. The interrupt control circuit 24 receives signals for controlling the internal circuits 1 to 3, such as On and Off signals, and outputs these signals to the signal generating circuit 26. The signal generating circuit 26 generates control signals for controlling the first switches SW1A to SW3A and the second switches SW1B to SW3B based on the On and/or Off signals and the decision information retained in the register 22.

Figure 6:
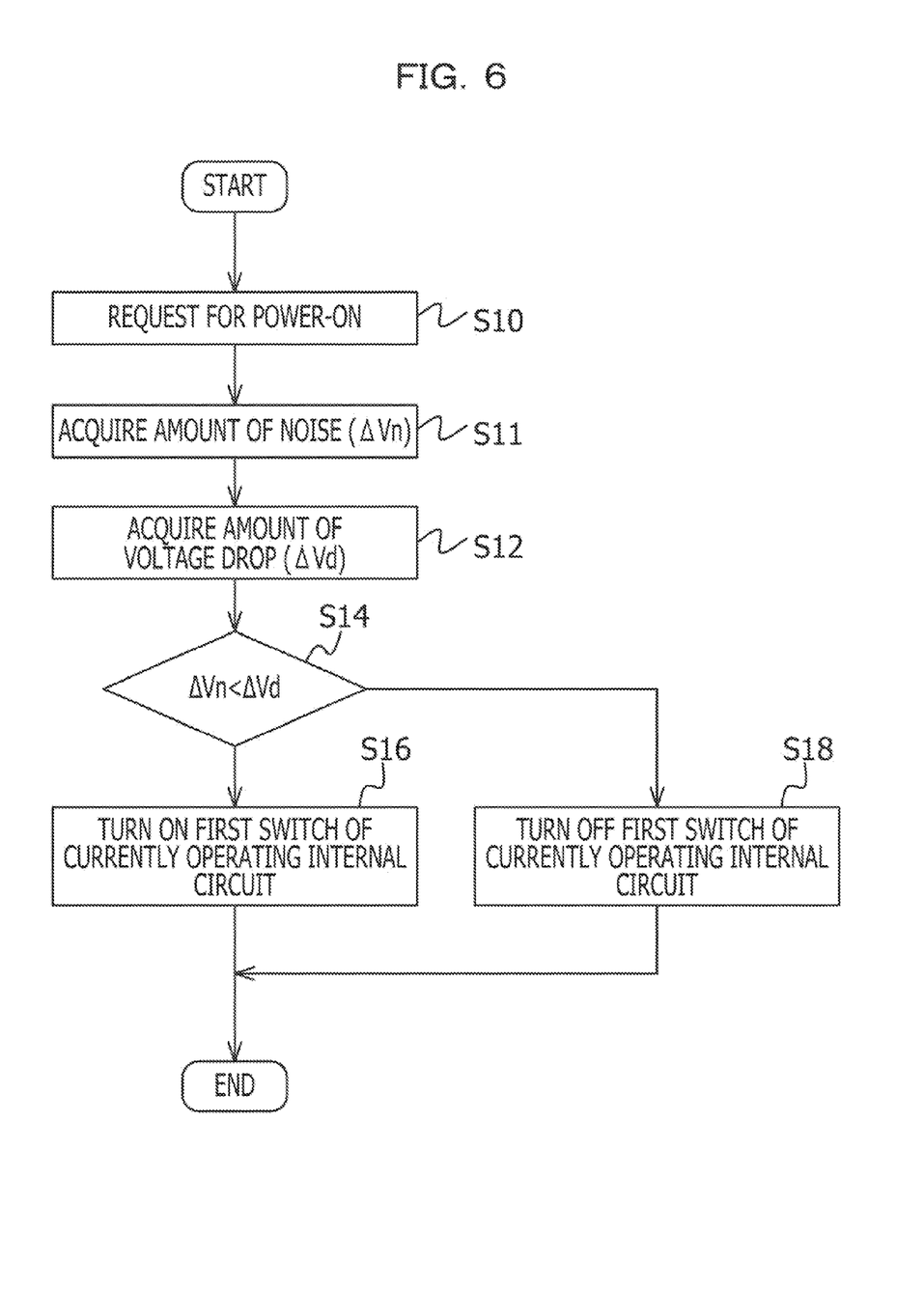
FIG. 6 illustrates an exemplary operation of a semiconductor device.

FIG. 6 illustrates an exemplary operation of a semiconductor device. The operation illustrated in FIG. 6 may be executed at power-on by the control circuit 20 illustrated in FIG. 5. In operation S10, the control circuit 20 receives a request for power-on of one of the internal circuits 1 to 3. Upon power-on, the control circuit 20 acquires information about the amount of noise ($\Delta Vn$) induced in the power line VddB and the amount of voltage drop ($\Delta Vd$) in operations S11 and S12, respectively. In operation S14, the control circuit 20 compares the amount of noise and the amount of voltage drop. When $\Delta Vn < \Delta Vd$ (Yes in operation S14), the control circuit 20 turns on the first switches SW1A to SW3A of any of the other of the internal circuits 1 to 3 that are in operation in operation S16. When $\Delta Vn > \Delta Vd$ (No in operation S14), the control circuit 20 turns off the first switches (SW1A to SW3A) of any of the other of the internal circuits 1 to 3 that are in operation in operation S18.

Figure 7:
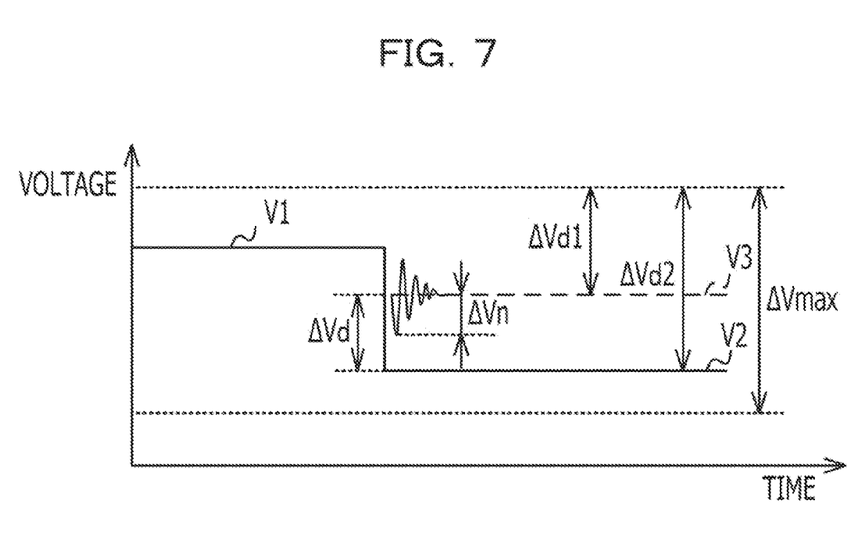
FIG. 7 illustrates an exemplary decision process.

FIG. 7 illustrates an exemplary decision process. The decision process illustrated in FIG. 7 may correspond to operation S14 illustrated in FIG. 6. Voltage V1 illustrated in a graph of FIG. 7 indicates the voltage of the power line VddB before power-on. Voltage V2 illustrated by a solid line indicates a voltage of the power line VddB when the bypass power line VddA is not used, for example, when the first switches SW1A to SW3A turn off. Voltage V3 illustrated by a long dashed line indicates a voltage of the power line VddB when the bypass power line VddA is used, for example, when the first switches SW1A to SW3A turn on. Upper and lower short dashed lines indicate a range of voltage levels $\Delta Vmax$ within which malfunctions in the internal circuits 1 to 3 do not occur.

The amount of voltage drop when the bypass power line VddA is used may be $\Delta Vd$. The amount of voltage drop when the bypass power line VddA is not used may be $\Delta Vd2$. The difference between $\Delta Vd2$ and $\Delta Vd1$ ($\Delta Vd = \Delta Vd2 - \Delta Vd1$) is indicated by $\Delta Vd$ in the graph of FIG. 7. The amount of noise generated at power-on of one of the internal circuits 1 to 3 may be the amplitude of the noise indicated by $\Delta Vn$ in this graph. When $\Delta Vn$ is smaller than $\Delta Vd$, the noise generated at power-on of the relevant internal circuit may have little influence on the other internal circuits in operation. When the first switches SW1A, SW2A, and SW3A of an operating one of the internal circuits 1 to 3 are turned on and the bypass power line VddA is used as a wiring for power supply as illustrated in operation S16 of FIG. 6, the impedance of the power supply wiring may be reduced, thereby improving current supply capacity. If $\Delta Vn$ is larger than $\Delta Vd$, noise generated at power-on of one of the internal circuits 1 to 3 may greatly influence the other internal circuits in operation. If the first switches SW1A, SW2A, and/or SW3A of an operating one of the internal circuits 1 to 3 are turned off, as illustrated in operation S18 of FIG. 6, the amount of noise transmitted from the bypass power line VddA to the internal circuits 1 to 3 may be reduced.

The amount of voltage drop $\Delta Vd$ and the amount of noise $\Delta Vn$ may be determined by technical specifications of internal circuits, such as circuit size, consumption current, capacitance between power lines, or power line layout. For example, an internal circuit having a small circuit size may generate a small amount of noise at power-on. The amount of voltage drop $\Delta Vd$ and the amount of noise $\Delta Vn$ at power-on of each internal circuit may be obtained in advance. The control circuit 20 may store the amount of voltage drop $\Delta Vd$ or the amount of noise $\Delta Vn$ as a parameter of the decision information in the register 22, and may refer to this information when necessary.

Figure 8:
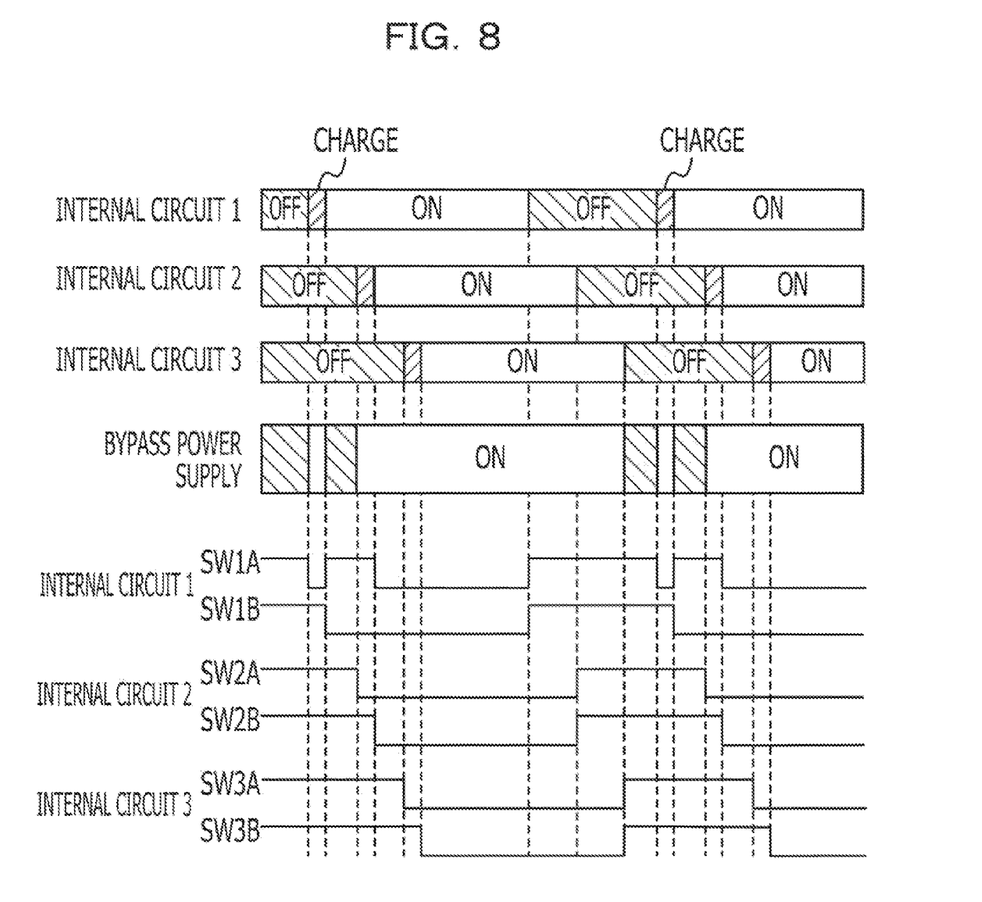
FIG. 8 illustrates an exemplary operation of a semiconductor device.

FIG. 8 illustrates an exemplary operation of a semiconductor device. The semiconductor device may be the semiconductor device in a semiconductor device having the control circuit 20 illustrated in FIG. 5. For example, the internal circuits 1, 2, and 3 may be sequentially powered on in this order and the control circuit 20 may detect that ΔVn is smaller than ΔVd (ΔVn<ΔVd) at power-on of the internal circuits 2 and 3.

The internal circuit 1 may be first powered on as illustrated in FIG. 8. The control circuit 20 turns on the second switch SW1B after keeping the first switch SW1A on for a certain period of time. The first switch SW1A is turned off. After the internal circuit 2 is powered on, the control circuit 20 turns on the second switch SW2B after keeping the first switch SW2A on for a certain period of time. Unlike the case of the internal circuit 1, the first switch SW2A of the internal circuit 2 is kept on at this time. The first switch SW1A of the internal circuit 1 is turned on. After the internal circuit 3 is powered on, the control circuit 20 turns on the second switch SW3B after keeping the first switch SW3A on for a certain period of time. Similar to the internal circuit 2, the first switch SW3A of the internal circuit 3 is kept on at this time.

Figure 9:
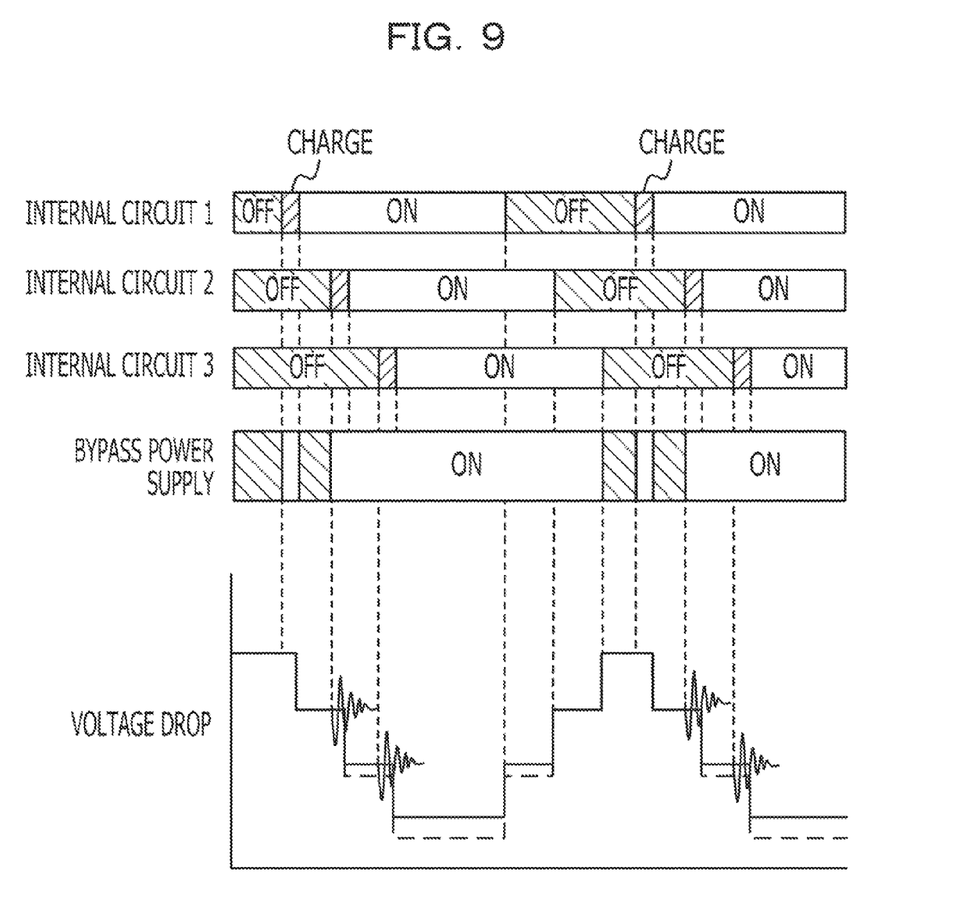
FIG. 9 illustrates an exemplary voltage drop.

FIG. 9 illustrates an exemplary voltage drop. The voltage drop illustrated in FIG. 9 may be a voltage drop in the power line VddB of a semiconductor device including the control circuit 20 illustrated in FIG. 5. In a graph of FIG. 9, voltage drops in the semiconductor device including the control circuit 20 illustrated in FIG. 5 are represented by solid lines, while voltage drops in the semiconductor device 100A illustrated in FIG. 2 are represented by broken lines. After the internal circuit 1 is powered on, there may be no difference between the amount of voltage drop illustrated by a solid line and the amount of voltage drop illustrated by a broken line. When the internal circuit 2 is powered on, the amount of voltage drop in the semiconductor device including the control circuit 20 illustrated in FIG. 5 that uses the bypass power line VddA as a voltage source becomes smaller than the amount of voltage drop occurring in the semiconductor device 100A illustrated in FIG. 2. When the internal circuit 3 is powered on, the amount of voltage drop in the semiconductor device including the control circuit 20 illustrated in FIG. 5 remains smaller than the amount of voltage drop in the semiconductor device 100A illustrated in FIG. 2. Since the first switches SW1A to SW3A are kept on at this point, the bypass power line VddA may be subject to the influence of noise. The amount of voltage drop in the semiconductor device illustrated in FIG. 6 may be substantially equal to the amount of voltage drop in the semiconductor device 100 illustrated in FIG. 1, the power supply wiring of which is entirely used as the power line Vdd and is not used as the bypass power line VddA.

In the semiconductor device including the control circuit 20 illustrated in FIG. 5, the control circuit 20 acquires in advance the amount of noise and the amount of voltage drop in the internal circuit to be powered on, for example, the internal circuit 1. The control circuit 20 controls the first switches of the other internal circuits, for example, the switches SW2A and SW3A coupled respectively to the internal circuits 2 and 3, based on the amounts of noise and voltage drop. When the noise substantially influences the other internal circuits in operation, the control circuit 20 turns off the first switches, thereby cutting off the noise transmitted through the second power line, for example, the bypass power line VddA. Therefore, the internal circuit may be protected. When the noise has little influence, for example, is canceled out by the voltage drop, the control circuit 20 turns on the first switches, thereby increasing the number of power lines for supplying the source voltage Vdd. The impedance of the power supply wiring and the voltage drop may be reduced. Consequently, the influence of noise at power-on as well as the amount of voltage drop in the internal circuits in operation may be reduced.

The first switches SW1A to SW3A of the internal circuits 1 to 3 are controlled based on the amount of voltage drop ΔVd and the amount of noise ΔVn as illustrated in FIGS. 6 and 7. Other methods may be used. For example, the control circuit 20 may determine whether a value, which is obtained by adding the change amount of noise ΔVn to the accumulated amount of voltage drop ΔVd1 (the difference between an upper limit of the range of permissible voltage levels and the voltage V2) when the bypass power line VddA illustrated in FIG. 7 is used, falls within the range of voltage levels ΔVmax where the internal circuits do not malfunction. When ΔVd1+ΔVn<ΔVmax, the first switches of the operating internal circuits other than the internal circuit which is powered on may be turned on, and when ΔVd1+ΔVn>ΔVmax, the first switches may be turned off, for example. The first switches may be turned on when the value obtained by adding the amounts of noise and voltage drop in the power line VddB at power-on is at a level that may not cause the other operating internal circuits to malfunction. The first switches may be turned off when the value is at a level that may cause the other operating internal circuits to malfunction.

Figure 10:
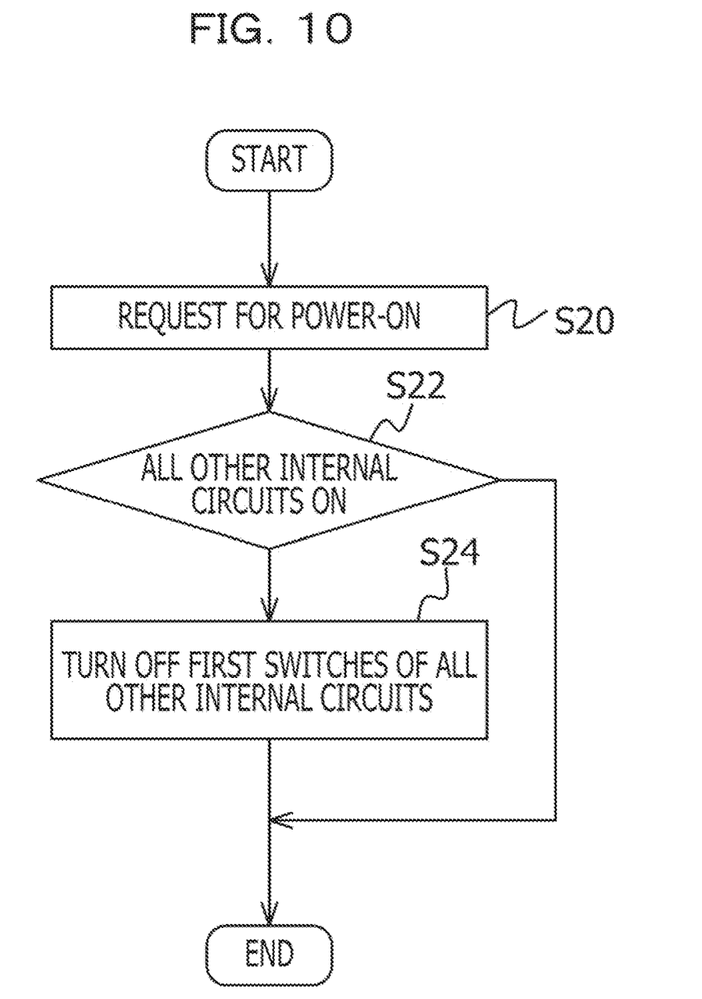
FIG. 10 illustrates an exemplary operation of a semiconductor device.

FIG. 10 illustrates an exemplary operation of a semiconductor device. The operation illustrated in FIG. 10 may be executed at power-on by the semiconductor device including the control circuit 20 illustrated in FIG. 5. In operation S20, the control circuit 20 receives a request for power-on of one of the internal circuits. In operation S22, the control circuit 20 determines whether the other of the internal circuits is in operation. When the other of the internal circuits is in operation, the control circuit 20 turns on the first switches (SW1A to SW3A) of the other of the internal circuits in operation.

Figure 11:
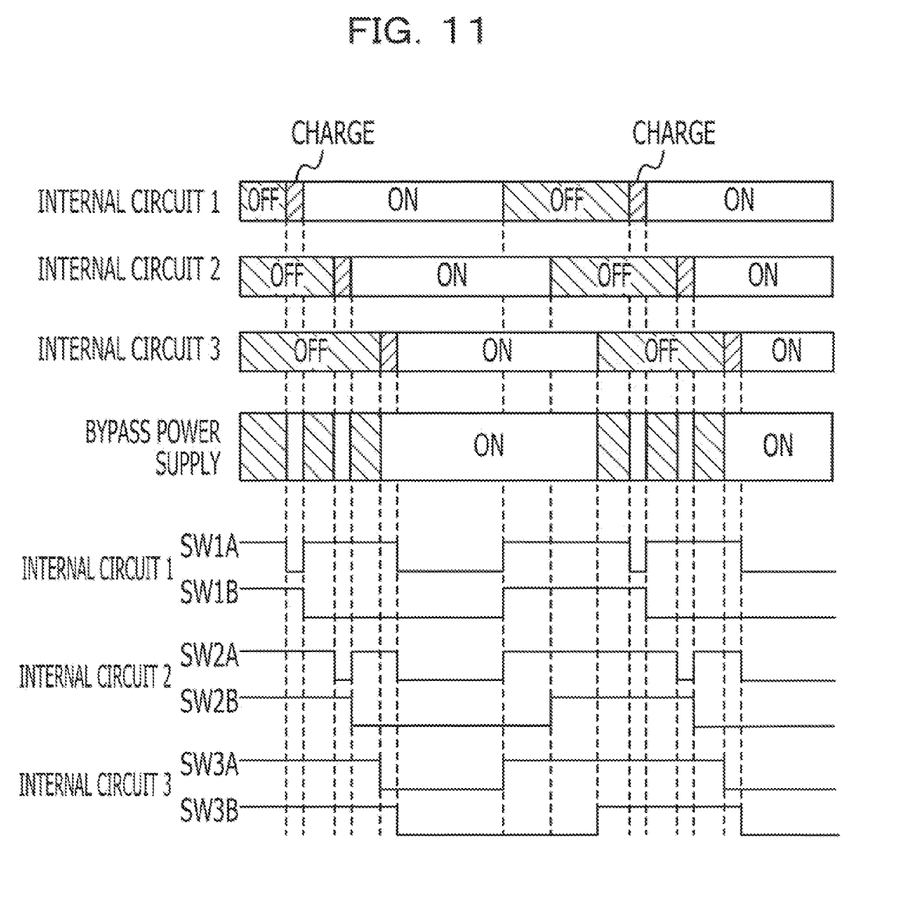
FIG. 11 illustrates an exemplary operation of a semiconductor device.

FIG. 11 illustrates an exemplary operation of a semiconductor device. The semiconductor device illustrated in FIG. 11 may be a semiconductor device including the control circuit 20 illustrated in FIG. 5. The internal circuits 1, 2, and 3 may be sequentially powered on in this order. For example, the internal circuit 1 may be first powered on. After keeping the first switch SW1A on for a certain period of time, the control circuit 20 turns on the second switch SW1B and turns off the first switch SW1A. Upon power-on of the internal circuit 2, the control circuit 20 keeps the first switch SW2A on for a certain period of time, turns on the second switch SW2B and then turns off the first switch SW2A in succession. Upon power-on of the internal circuit 3, the control circuit 20 keeps the first switch SW3A on for a certain period of time and turns on the second switch SW3B. Since the internal circuits 1 and 2 are both in operation, the control circuit 20 turns on the first switch SW1A of the internal circuit 1 and the first switch SW2A of the internal circuit 2 contemporaneously with the second switch SW3B of the internal circuit 3. The first switches SW1A to SW3A and the second switches SW1B to SW3B are turned on.

Figure 12:
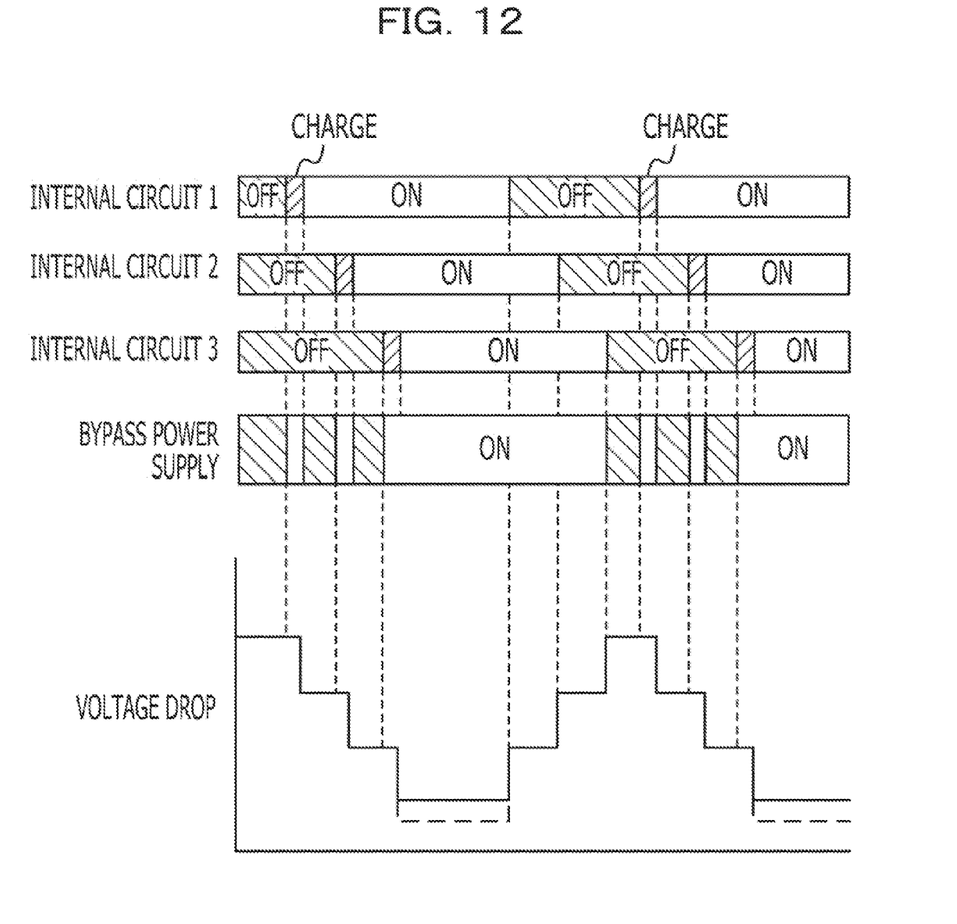
FIG. 12 illustrates an exemplary voltage drop.

FIG. 12 illustrates an exemplary voltage drop. The voltage drop illustrated in FIG. 12 may be the voltage drop in the power line VddB of a semiconductor device including the control circuit 20 illustrated in FIG. 5, for example. Stepped solid lines illustrated in FIG. 12 represent voltage drops in the semiconductor device that performs the operations illustrated in FIG. 11 or 12. The stepped broken lines illustrated in FIG. 12 represent voltage drops in the semiconductor device 100A of FIG. 2. The amount of voltage drop illustrated by a solid line and the amount of voltage drop illustrated by a broken line when the internal circuits 1 and 2 are powered on are substantially equal to each other. When the internal circuit 3 is powered on, the amount of voltage drop illustrated by a solid line becomes smaller than the amount of voltage drop illustrated by a broken line. The amount of voltage drop in the power line VddB when all of the internal circuits are in operation may be substantially equal to the amount of voltage drop in the semiconductor device 100 illustrated in FIG. 1, which includes power supply wiring as the power line Vdd and does not include the bypass power line VddA, for example.

When the internal circuits 1 to 3 are in operation, the control circuit 20 turns on the switches SW1 to SW3. Since no other internal circuits are powered on when the internal circuits are in operation, no noise occurs in the bypass power line VddA as a result of power-on of an internal circuit. Therefore, the influence of noise when the switches SW1 to SW3 are powered-on may be substantially the same as the influence of noise on the semiconductor device 100A illustrated in FIG. 2. Since the bypass power line VddA serving as the second power line is used to supply electric power, the number of power lines for power supply increases, thereby reducing the impedance of power supply wiring and the voltage drop.

The operation of the semiconductor device having the control circuit 20 illustrated in FIG. 5 and that of the semiconductor device illustrated in FIG. 10 may be combined. For example, the first switches may be controlled based on the amounts of noise and voltage drop at power-on of the internal circuit, and the first switches of all of the internal circuits may be turned on when all these internal circuits are in operation. The influence of noise and voltage drop at power-on may be reduced effectively.

Example embodiments of the present invention have now been described in accordance with the above advantages. It should be appreciated that these examples are merely illustrative of the invention. Many variations and modifications will be apparent to those skilled in the art.

The invention claimed is:

1. A semiconductor device comprising:
   a first power line to supply a first voltage to a plurality of internal circuits;
   a second power line to supply the first voltage to the plurality of internal circuits;
   a plurality of first switches provided between the first power line and each of the plurality of internal circuits;
   a plurality of second switches provided between the second power line and each of the plurality of internal circuits; and
   a control circuit to
      acquire amounts of noise and voltage drop at power-on in each internal circuit included in the plurality of the internal circuits, and
      control a first switch of a first internal circuit and a first switch of a second internal circuit included in the plurality of the internal circuits based on the acquired amounts of noise and voltage drop
   wherein the control circuit turns on a second switch of the first internal circuit after turning on the first switch of the first internal circuit,
   the control circuit turns off the first switch of the first internal circuit after turning on the second switch of the first internal circuit,
   the control circuit turns on a second switch of the second internal circuit after turning on the first switch of the second internal circuit,
   the control circuit turns on the first switch of the first internal circuit when the amount of the noise acquired is smaller than the amount of the voltage drop acquired, and
   the control circuit turns off the first switch of the second internal circuit when the amount of the noise acquired is larger than the amount of the voltage drop acquired.

2. The semiconductor device according to claim 1, wherein the control circuit turns on the first switch of each of the plurality of internal circuits when all of the plurality of internal circuits are in operation.

3. The semiconductor device according to claim 1, wherein the first power line includes a smaller current supply capacity than the second power line.

4. The semiconductor device according to claim 1 further comprising:
   a third power line to supply a second voltage.

* * * * *